United States Patent [19]

Gilbert

[11] B 3,981,265
[45] Sept. 21, 1976

[54] COMBINED DIAL SCALE AND STATION INDICATOR

[75] Inventor: Paul B. Gilbert, Chicago, Ill.

[73] Assignee: Motorola, Inc., Schaumburg, Ill.

[22] Filed: May 6, 1974

[21] Appl. No.: 467,412

[44] Published under the second Trial Voluntary Protest Program on January 13, 1976 as document No. B 467,412.

[52] U.S. Cl. ............................ 116/124.4; 40/130 B;
116/DIG. 5; 179/100.11; 350/96 R
[51] Int. Cl.² ..................... G11B 31/00; H03J 01/04
[58] Field of Search ............. 116/124.1 R, 124.2 R,
116/124.3, 124.4, DIG. 5, DIG. 36, 129 P,
129 K; 179/100.11; 360/137; 240/2.1;
350/114, 112, 113, 96 R; 40/130 R, 130 B

[56] References Cited
UNITED STATES PATENTS

| | | | |
|---|---|---|---|
| 1,869,221 | 7/1932 | Latzko et al. | 350/114 X |
| 1,894,111 | 1/1933 | Marcellus | 350/113 X |
| 2,215,310 | 9/1940 | Zupanec | 350/113 |
| 2,328,485 | 8/1943 | Ott | 116/129 L |
| 2,402,856 | 6/1946 | Turrettini | 350/114 X |
| 2,428,792 | 10/1947 | Evans | 116/129 P |
| 2,520,028 | 8/1950 | Biskind | 116/129 L |
| 2,711,711 | 6/1955 | Harman | 116/124.4 |
| 2,823,639 | 2/1958 | Vistain, Jr. et al. | 116/124.4 |
| 2,885,992 | 5/1959 | Roberts et al. | 116/124.4 |
| 2,972,283 | 2/1961 | Karnow | 350/114 X |
| 3,344,700 | 10/1967 | Brake | 350/112 X |
| 3,513,805 | 5/1970 | Sizer | 116/124.4 |
| 3,536,859 | 10/1970 | Tolar | 179/100.11 |
| 3,692,383 | 9/1972 | Herod et al. | 350/96 R |
| 3,761,704 | 9/1973 | Takeiche et al. | 116/124.4 X |
| 3,800,328 | 3/1974 | Harlan et al. | 360/137 |
| 3,821,489 | 6/1974 | Kocubej | 179/100.11 |

*Primary Examiner*—Richard C. Queisser
*Assistant Examiner*—Daniel M. Yasich
*Attorney, Agent, or Firm*—James W. Gillman; Donald J. Lisa

[57] ABSTRACT

A radio receiver and magnetic tape player combination having a radio control mechanism and a housing with an opening to receive a magnetic tape cartridge, includes a dial door and station indicator mounted in the housing and movable between a first position wherein the opening is closed and a second position clear of the opening to permit entry of the cartridge. The dial door and station indicator includes indicia therein to indicate the frequency to which the radio receiver is tuned, and an angled reflecting surface positioned adjacent the indicia. A pointer, movably mounted in the housing and operatively connected to the radio control mechanism, includes a reflecting surface on one end. When the pointer is illuminated by a light source mounted in the housing, the reflection from the reflecting surface of the pointer impinges upon the beveled surface to cause the pointer to appear on the background indicia within the dial door to indicate the frequency to which the radio receiver is tuned.

14 Claims, 5 Drawing Figures

U.S. Patent Sept. 21, 1976 3,981,265
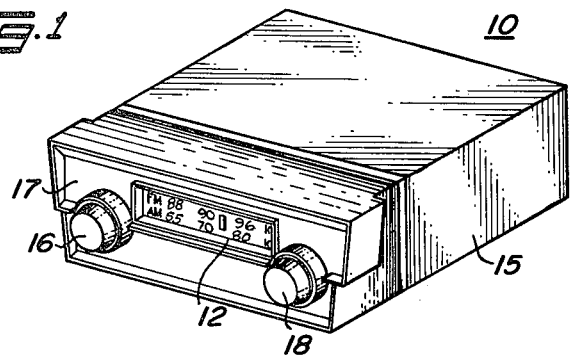
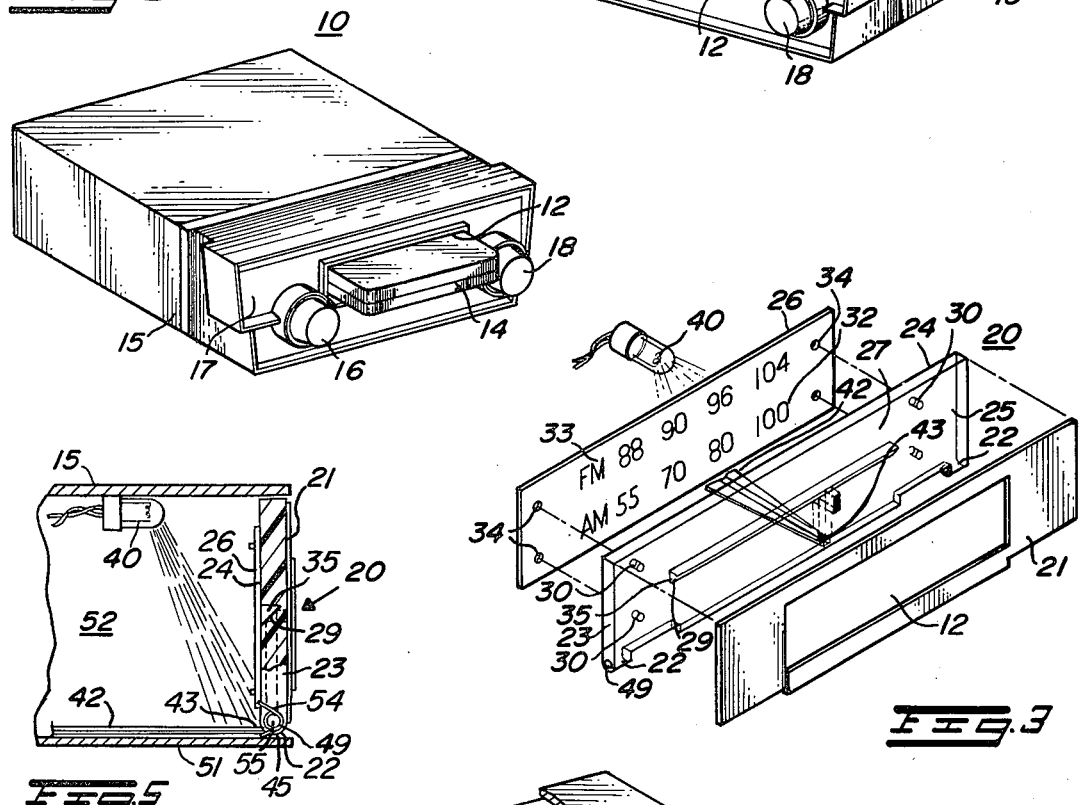
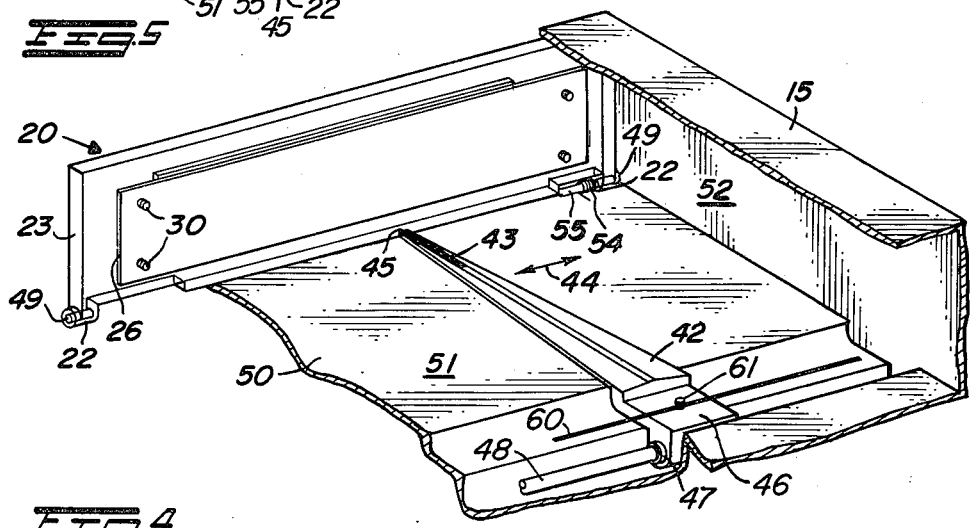

COMBINED DIAL SCALE AND STATION INDICATOR

BACKGROUND OF THE INVENTION

In the past, in radio receiver and magnetic tape player combinations, the front panel of the unit includes a door member which covers the cartridge receiving opening in the tape player and a dial scale having indicia thereon to indicate the frequency to which the radio receiver is tuned. However, because such a construction was bulky, its adaption to fit into the dash panel presented many drawbacks. To overcome this deficiency, many prior art devices combined the cartridge door member and dial scale together. In such a device, the dial member included also indicia thereon and a pointer mechanism therein for indicating the frequency to which the radio receiver is tuned. Necessarily, such a pointer mechanism was pivotally mounted so that it can be pivoted out of the way with the pivoted dial door when a cartridge was inserted into the opening. Moreover, such devices required the use of complex linking systems such as either pulleys or levers between the pointer mechanism, the door member and the radio control mechanism to position the pointer to indicate the frequency to which the radio receiver is tuned. Consequently, such devices have resulted in a player construction that is complex in structure and, therefore, costly to manufacture.

More recently, some prior art devices have included a mirror surface mounted to the inside of the dial member to reflect the position of a movable pointer to indicate the frequency to which the radio receiver is tuned. However, such devices have been bulky in construction and costly to manufacture and have resulted in a parallax effect in visually reading the frequency to which the radio receiver is tuned because the mirror image of the movable pointer is necessarily some distance from the indicia on the dial door.

SUMMARY OF THE INVENTION

Accordingly, it is an object of this invention to provide an improved dial door and station indicator which may be utilized to cover the cartridge receiving opening in a radio receiver and magnetic tape player combination.

Another object of this invention is to provide an improved dial door and station indicator which eliminates the necessity of having a pointer pivotally mounted in the dial door and station indicator.

A further object of this invention is to provide an improved dial door and station indicator which eliminates the necessity of a linkage system between the pointer mounted in the dial door and station indicator.

Briefly, the dial door and station indicator of the present invention is utilized in a radio receiver and magnetic tape player combination having a housing with an opening to receive a magnetic tape cartridge and a radio control mechanism for controlling the frequency to which the radio receiver is tuned. The dial door and station indicator having indicia therein is pivotally mounted in the housing and movable between a first position wherein the opening is closed and a second position clear of the opening to permit entry of a cartridge. The dial door and station indicator includes a cover portion, a door portion having an angled reflecting surface therein extending transversely the length of the door plate and located intermediate the width of the door plate and a background portion having indicia thereon. A pointer is movably mounted in the housing and operatively connected to the radio control mechanism and includes a reflecting surface on the end thereof. A light source mounted in the housing illuminates the reflecting surface on the pointer such that the reflection therefrom impinges upon the angled reflecting surface therein to cause the pointer to appear on the background indicia within the dial door and station indicator to indicate the frequency to which the radio receiver is tuned.

BRIEF DESCRIPTION OF THE DRAWINGS

FIG. 1 is a perspective view of a radio receiver and magnetic tape player combination utilizing the dial door and station indicator of this invention;

FIG. 2 is a perspective view of a radio receiver and magnetic tape player combination of this invention showing the partial insertion of a cartridge into the player combination;

FIG. 3 is an expanded perspective view showing the dial door and station indicator of the instant invention;

FIG. 4 is a perspective view of a portion of the radio receiver and magnetic tape player combination showing the dial door and station indicator of the instant invention covering the cartridge receiving opening of the player combination; and FIG. 5 is an end view in cross-section of another embodiment of the dial door and station indicator in accordance with the instant invention.

DETAILED DESCRIPTION

Referring now to the drawings, FIGS. 1 and 2 show a radio receiver and magnetic tape player combination, designated generally by the reference numeral 10. The radio receiver and magnetic tape player combination 10 has formed therein an aperture or opening 12 into which is readily inserted a tape cartridge 14 which contains a quantity of magnetic tape. The radio receiver and magnetic tape player 10 includes a housing 15 and an escutcheon plate 17 and further includes, within the housing, the usual cartridge receiving tunnel or cavity (FIG. 4). The magnetic tape in the cartridge 14 has audio signal information thereon to be reproduced by the radio receiver and magnetic tape player 10 in a well-known manner. A quantity of endless tape is supported within the cartridge 14, and tape transport and magnetic head means are provided within the radio receiver and magnetic tape player 10, as is well-known in the art. A volume and tone control 16 and a radio frequency control 18, respectively, may be provided as necessary. A radio tuning control mechanism for controlling the frequency to which the radio receiver is tuned is also provided within the radio receiver and magnetic tape player 10, as is well-known in the art.

In FIG. 3, a dial door and station indicator 20 of the instant invention includes a cover portion 21, a door portion 23 and a background portion 26. The door portion 23 is mounted to the housing 15 by mounting support members 22 attached to each end thereof (FIG. 5) as will hereinafter be described. The door portion 23 is comprised of a transparent material, such as a Lucite acrylic plastic, which possesses light refraction characteristics, and includes an inner surface 24 and an outer surface 25. The inner surface 24 of door portion 23 includes an angled reflecting surface 29 thereon extending transversely the length of the door portion 23 and located intermediate the width of the door portion 23. The angled reflecting surface 29 is positioned on the inner surface 24 at substantially a 45 degree angle from the vertical plane of door portion 23. The angled reflecting surface 29 may be formed during molding of the transparent acrylic door portion 23 or may be formed by cutting an angled notch 35 on the inner surface 24 in the transparent acrylic door portion 23. The opaque background portion 26 includes translucent AM/FM log markings or indicia 32 and 33, respectively and may include a plurality of openings 34 therein. Preferably, the background portion 26 is positioned and held against the inner surface 24 of door portion 23 by mating the openings 34 with a plurality of projections 30 on the inner surface. However, the attachment of the background portion 26 to the door portion 23 by means of an adhesive material is within the spirit of this invention.

The outer surface 25 of door portion 23 may include an extension 27 thereon, which extension outlines the AM/FM indicia 32 and 33 on the background portion 26. The cover portion 21 is preferably an adhesive backed aluminum overlay with an opening 42 therein which opening is adapted to receive the extension 27 of door portion 23 when the cover portion 21 is mounted on the door portion 23. The cover portion is used to protect the door portion from abrasion of the cartridge 14 upon its insertion into and removal from the cartridge receiving opening 12 and to conceal the attachment of the background portion 25 to the door portion 23. A light source 40 and a pointer 42 having a reflecting surface 43 on the end thereof are diagrammatically shown to illustrate the reflection of a light image from the reflecting surface 43 of the pointer 42 through the door portion 23 whereby the light image impinges upon the angled reflecting surface 29 to cause the image to appear on the background indicia within the dial door and station indicator 20.

In FIG. 4, the mounting of the dial door and station indicator 20 within the housing 15 is shown. The housing 15 encloses a cartridge receiving chamber or cavity 50 having a base 51 and sidewall 52. The dial door 20 is mounted to the housing 15 by mounting support members 22 on door portion 23. The mounting support members have openings 49 therein for receiving a rod or pivot 55 to permit the pivotal mounting of the dial door 20 to sidewall 52 of cartridge receiving chamber 50. A spring means 54 is provided on rod 55 to return the dial door 20 to the first position wherein the opening 12 is closed from the second position clear of the opening to permit entry of the cartridge 14 into the cartridge receiving chamber 50. A pointer 42 is movably mounted in the housing 15 and operatively connected to the radio control mechanism (not shown), as is well-known in the art. Basically, the pointer 42 is mounted on a cartridge 46 which is provided with guide slots 47. A guide rod 48 extends between sidewall 52 and an opposing sidewall (not shown) with the carriage 46 mounted thereon via guide slots 47. A cable 60 is affixed to the carriage 46 via a stud 61. The cable 60 is in mechanical configuration with radio frequency control 18 whereby as control 18 is rotated selecting various radio stations cable 60, and thereby carriage 46 and pointer 42, are responsively driven. Thus, the relative position of the pointer 42 is indicative of the frequency to which the receiver is tuned. Guide rod 48 constrains the pointer 42 to move in either a first or a second direction as indicated by double-headed arrow 44. Pointer 42 is further constrained via guide rod 48 coacting with guide slots 47, and with cable 60 acting upon stud 61, to remain in a vertical plane which is beneath the plane 52 to which dial door 20 will rotate during cartridge insertion. That is, as a cartridge is inserted in the opening 12 (as shown in FIGS. 1, 2 and 3) dial door 20 will rotate about its supporting members 22 thus rotating the axis of door 20 to a lower vertical position. The constraining forces on pointer 42 keep it in a relative position whereby with full cartridge insertion dial door 20 is in a vertical elevation above that of the pointer. Thus, an indicating system according to the invention allows a pointer-type readout without a pointer obstructing the entrance to the cartridge player. A pointer end 45 includes a reflecting surface 43 thereon to reflect a light image from a light source (as shown in FIGS. 3 and 5) onto the angled reflecting surface 29 whereby the pointer is caused to appear on the background indicia within the dial door and station indicator 20 to indicate the frequency to which the radio receiver is tuned.

FIG. 5 shows a further embodiment of the dial door and station indicator according to the invention, wherein identical numerals are used to illustrate like parts as shown in FIGS. 3 and 4. The dial door 20 is similar in construction to that shown in FIGS. 3 and 4 and includes a cover portion 21, a door portion 23 and a background portion 26. The door portion 23 is comprised of a transparent material, such as an acrylic plastic, which possess light refraction characteristics, as has been hereinabove described. The inner surface 24 of door portion 23 includes an angled reflecting surface 29 thereon extending transversely the length of the door portion and located intermediate the width of the door portion 23. The angled reflecting surface 29 is positioned on the inner surface 24 at preferably a 45 degree angle from the vertical plane of door portion 23. However, it has been found that the angled reflecting surface 29 is operable when the reflecting surface is positioned between the range of 42.5° – 47.5° from the vertical plane of door portion 23.

The door portion 23 includes support member 22 having an opening 49 therein for receiving a rod or pivot 55 to permit the pivotal mounting of dial door 20 to sidewall 52 of housing 15. Spring means 54 is provided on rod 55 to return the dial door 20 to the first position wherein the opening 12 (as shown in FIGS. 1, 2 and 3) is closed from the second position clear of the opening to permit entry of the cartridge 14 into the cartridge receiving chamber 50. A pointer 42 is movably mounted in the housing 15 and includes a reflecting surface 43 thereon at pointer end 45 to reflect a light image from a light source 40 onto the angled reflecting surface 29 whereby the pointer is caused to appear on the background indicia within dial door 20, as has hereinabove been described.

By providing a dial door and station indicator having no moving parts which cooperates with the radio frequency pointer mechanism mounted in the housing to indicate the frequency to which the radio receiver is tuned, the necessity of having a movable pointer mounted in the dial door has been eliminated. Such a construction results in a player having less moving parts and a better construction than the prior art devices. Additionally, in some prior devices the movable pointer was reflected by a mirror mounted to the rear of the door. Such devices resulted in a parallax effect in visually reading the frequency to which the radio receiver is tuned because the reflected pointer image is necessarily some distance from the indicia on the dial door. Such an effect is eliminated by the instant invention because the station indicator is projected directly onto the outer surface of the dial door to indicate the frequency to which the radio receiver is tuned.

What has been described is a simple and efficient means of utilizing a dial door and station indicator having no moving parts which functions as the magnetic tape player opening cover as well as a radio dial scale to indicate the frequency to which the radio receiver is tuned. While a preferred embodiment of the invention has been described in detail, it should be understood that many variations thereof are possible, all of which fall within the true scope of the invention.

For example, an indicating system according to the invention may be used in other than a radio-tape player combination. Generally, an indicating system according to the invention includes a display made of a translucent material having a readout surface. Formed in the translucent material, in predeterminedly positioned fashion, is a reflecting surface. A mechanism is driven in response to the status of the parameter being displayed. Operatively connected to the mechanism in optical configuration with the reflecting surface is a source of light. Thus, as the mechanism moves in response to changing parameter status, an image of the source of light is reflected from the reflecting surface, appearing through the readout surface.

Graduated scale markings may be added to the display and aligned with the reflecting image such that the image is opposite the marking representative of parameter status.

The system may be adaptable to the conventional pointer display, as discussed above with respect to the radiotape cartridge player, by providing a reflecting material on the pointer, placing the pointer in optical configuration with the reflecting surface, operatively coupling the pointer to the mechanism, and illuminating the reflecting material, whereby the image of the pointer is visible through the readout surface. An embodiment of the pointer system includes the longitudinal axis of the pointer being constrained to operate in a first plane. This first plane is substantially perpendicular to a second plane containing the readout surface. When using an acrylic material, such as Lucite, a preferred position for the reflecting surface is in a third plane oriented at 45° angles to both the first and the second planes.

I claim:

1. In a radio receiver and magnetic tape player combination having a radio tuning control mechanism for controlling the frequency to which the radio receiver is tuned, and a housing provided with an opening to receive a magnetic tape cartridge, the combination including:
    a door having indicia thereon to indicate the frequency to which the radio receiver is tuned, said door being mounted in the housing and movable between a first position wherein the opening is closed and a second position clear of the opening to prevent entry of a cartridge;
    a pointer movably mounted in the housing and operatively connected to the radio control mechanism, said pointer having a reflecting surface thereon;
    reflection means including an angled reflecting surface provided in said door in position adjacent said indicia on said door for cooperating with the reflecting surface on said pointer; and
    illumination means mounted in the housing for illuminating the reflecting surface on said pointer such that the reflection therefrom impinges upon said reflection means to illuminate said indicia on said door when said door is in the first position to indicate the frequency to which the radio receiver is tuned.

2. The radio receiver and magnetic tape player combination according to claim 1 wherein the angle of said reflecting surface is substantially at a 45° angle relative to the vertical plane of said door.

3. The radio receiver and magnetic tape player combination according to claim 1 wherein said door comprises a transparent plastic material.

4. The radio receiver and magnetic tape player combination according to claim 3 wherein the transparent plastic material is an acrylic.

5. The radio receiver and magnetic tape player combination according to claim 1 wherein the combination further includes spring means engageable with said door when said dial door is in the second position clear of the opening to return the dial door to the first position.

6. The radio receiver and magnetic tape player combination according to claim 1 wherein said door further includes a background portion having indicia thereon to indicate the frequency to which the radio receiver is tuned.

7. A door assembly for a radio receiver and magnetic tape player combination having a radio tuning control mechanism for controlling the frequency to which the radio receiver is tuned, a radio tuning indicator mechanism and illumination means for illuminating the radio tuning indicator mechanism, a housing with an opening to receive a magnetic tape cartridge, such door assembly including:
    a panel of light transmitting material mounted in the housing and movable between a first position wherein the opening is closed and a second position clear of the opening to permit entry of a cartridge, said panel including an angled reflecting surface formed therein extending transversely across said door portion, and
    background means having indicia thereon extending transversely across said panel, said reflecting surface and said background means cooperating together such that the reflection from the radio tuning indicator mechanism impinges upon the angled reflecting surface in said door portion to illuminate said panel at a position related to said indicia to indicate the frequency to which the radio receiver is tuned.

8. The door assembly of claim 7 wherein the panel of light transmitting material is an acrylic plastic.

9. A system for indicating the status of a parameter comprising
    display means including a translucent material having first and second surfaces, the first surface adapted for transmitting light to the interior of the translucent material and the second surface serving as a readout surface,
    a carriage mechanism,
    means for driving the carriage mechanism in response to the parameter status,
    wherein the improvement comprises
    the display means including a predeterminedly positioned reflecting surface formed internally in the translucent material, and laterally extending substantially across the readout surface and means for producing an image, the lateral extension of which is small relative to the lateral extension of the reflecting surface, at least a portion of the image producing means being operably connected to the carriage mechanism for movement therewith and constrained to travel with respect to the first surface and the reflecting surface such that, for every position of the carriage mechanism, the image from the image producing means passes through the first surface and is reflected by the reflecting surface through the readout surface, whereby a change in the status of the parameter results in a corresponding relocation of the image as viewed through the readout surface.

10. The system of claim 9 wherein the display means further comprises graduated scale markings viewable through the readout surface and aligned with the reflected image.

11. The system of claim 9 wherein the means for producing an image comprises
- a reflector means operably connected to the mechanism and in optical configuration with the reflecting surface, and
- a means for illuminating the reflector.

12. The system of claim 11 wherein the reflector means comprises a pointer having a reflecting material deposited thereon.

13. The system of claim 12 wherein the longitudinal axis of the pointer is constrained to operate in a first plane parallel to the second surface and substantially perpendicular to a second plane containing the readout surface.

14. The system of claim 13 wherein the reflecting surface is in a third plane oriented at substantially 45° angles to both the first and second planes.

* * * * *

Disclaimer 3,981,265.—*Paul B. Gilbert*, Chicago, Ill. COMBINED DIAL SCALE AND STATION INDICATOR. Patent dated Sept. 21, 1976. Disclaimer filed Sept. 29, 1977, by the assignee, *Motorola, Inc.*

Hereby enters this disclaimer to claims 9 through 14 inclusive of said patent.

[*Official Gazette December 6, 1977.*]

UNITED STATES PATENT AND TRADEMARK OFFICE
CERTIFICATE OF CORRECTION

PATENT NO. : 3,981,265
DATED : September 21, 1976
INVENTOR(S) : Paul B. Gilbert

It is certified that error appears in the above-identified patent and that said Letters Patent are hereby corrected as shown below:

In claim 1, line 12, "prevent" should be changed to -- permit -- .

Signed and Sealed this

Tenth Day of October 1978

[SEAL]

Attest:

RUTH C. MASON
Attesting Officer

DONALD W. BANNER
Commissioner of Patents and Trademarks